(12) United States Patent
Huang et al.

(10) Patent No.: US 11,495,510 B2
(45) Date of Patent: Nov. 8, 2022

(54) SEMICONDUCTOR DEVICE PACKAGE STRUCTURE AND METHOD FOR FABRICATING THE SAME

(71) Applicant: United Microelectronics Corp., Hsinchu (TW)

(72) Inventors: Yu-Yuan Huang, Hsinchu (TW); Tsung-Kai Yu, Hsinchu County (TW); Chen-Hsiao Wang, Hsinchu (TW); Kai-Kuang Ho, Hsinchu (TW); Kuang-Hui Tang, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 24 days.

(21) Appl. No.: 16/780,639

(22) Filed: Feb. 3, 2020

(65) Prior Publication Data
US 2021/0202340 A1    Jul. 1, 2021

(30) Foreign Application Priority Data
Dec. 30, 2019  (CN) .......................... 201911393396.X

(51) Int. Cl.
*H01L 23/31* (2006.01)
*H01L 23/58* (2006.01)
*H01L 21/56* (2006.01)
*H01L 23/00* (2006.01)

(52) U.S. Cl.
CPC .......... *H01L 23/3178* (2013.01); *H01L 21/56* (2013.01); *H01L 23/3192* (2013.01); *H01L 23/564* (2013.01); *H01L 23/585* (2013.01)

(58) Field of Classification Search
CPC ... H01L 23/3178; H01L 23/585; H01L 21/56; H01L 23/564; H01L 23/3192; H01L 23/5226; H01L 23/3171; H01L 23/562
USPC ........................................................ 257/622
See application file for complete search history.

(56) References Cited

U.S. PATENT DOCUMENTS

| | | | |
|---|---|---|---|
| 6,028,347 A * | 2/2000 | Sauber ................ | H01L 23/3171 257/618 |
| 8,970,007 B2 | 3/2015 | Wada | |
| 9,679,855 B1 | 6/2017 | Lee et al. | |
| RE46,549 E * | 9/2017 | Minn ...................... | H01L 23/26 |
| 9,831,194 B1 * | 11/2017 | Lee ......................... | H01L 23/585 |
| 2006/0099775 A1 * | 5/2006 | Daubenspeck ....... | H01L 23/585 438/465 |
| 2008/0258266 A1 * | 10/2008 | Takemura ............. | H01L 23/585 257/620 |
| 2008/0277765 A1 * | 11/2008 | Lane .................... | H01L 23/5329 257/622 |
| 2009/0243044 A1 * | 10/2009 | Tanaka ................ | H01L 23/3171 257/618 |
| 2012/0211748 A1 * | 8/2012 | Miccoli ................. | B23K 26/53 257/52 |

(Continued)

*Primary Examiner* — Mohammad M Hoque
(74) *Attorney, Agent, or Firm* — J.C. Patents

(57) ABSTRACT

A semiconductor device package structure includes a substrate. The substrate has a circuit structure formed in a die region. The die region is defined by a plurality of scribe lines configured on the substrate. A seal ring is disposed in the substrate and located at a periphery region of the die region, and surrounds at least a portion of the circuit structure. A trench ring is disposed in the substrate between the seal ring and the scribe lines. A packaging passivation cap layer covers over the circuit structure and the seal ring, and covers at least the trench ring.

18 Claims, 3 Drawing Sheets

(56) References Cited

U.S. PATENT DOCUMENTS

| | | | |
|---|---|---|---|
| 2014/0027928 A1* | 1/2014 | Watanabe | H01L 21/56 |
| | | | 257/774 |
| 2017/0309536 A1* | 10/2017 | Yin | H01L 23/3142 |
| 2018/0012770 A1* | 1/2018 | Macelwee | H01L 21/78 |
| 2019/0131251 A1* | 5/2019 | Wang | H01L 23/3142 |
| 2020/0135662 A1* | 4/2020 | Iruvanti | H01L 24/16 |

* cited by examiner

SEMICONDUCTOR DEVICE PACKAGE STRUCTURE AND METHOD FOR FABRICATING THE SAME

CROSS-REFERENCE TO RELATED APPLICATION

This application claims the priority benefit of China patent application serial no. 201911393396.X, filed on Dec. 30, 2019. The entirety of the above-mentioned patent application is hereby incorporated by reference herein and made a part of this specification.

BACKGROUND

Technical Field

The disclosure relates to semiconductor fabricating technologies, and in particular, to a semiconductor device package structure and a method for fabricating the same.

Description of Related Art

Wafers used for fabricating integrated circuits are generally configured with a plurality of scribe lines in horizontal and vertical directions. The plurality of scribe lines in the horizontal and vertical directions intersect to define a plurality of circuit die regions. As such, a plurality of integrated circuits may be simultaneously fabricated in a plurality of circuit die regions. After the integrated circuits and package structures of the integrated circuits are fabricated, on an entire substrate including the integrated circuits, the integrated circuits are cut into a plurality of circuit dies along the scribe lines.

In order to protect the circuit die, an inner seal ring and an outer seal ring are formed along the scribe line around the die during fabrication. The inner seal ring is usually configured to, for example, prevent moisture from entering an integrated circuit. The outer seal ring is configured to, for example, protect a die from cracking during cutting of the die.

The inner seal ring and the integrated circuit form a portion of the die. The outer seal ring is generally formed in a range of the scribe line. During cutting of a circuit die, the outer seal ring can, for example, cushion a cutting force to prevent the die from cracking. The outer seal ring is a trench structure that surrounds the die.

However, if a packaging passivation layer externally covering the package structure, such as a passivation layer generally formed by a polybenzoxazole (PBO) material, is to cover only up to the inner seal ring, an external passivation layer edge may retract inward due to a deviation in a process condition and may fall on the inner seal ring. The inner seal ring generally has an uneven surface. Therefore, delamination may occur at an edge of the inner seal ring of the packaging passivation layer. The delamination results in a failure to withstand a testing stress during a subsequent test such as a surface mount test (SMT), resulting in damage to the integrated circuit.

In a packaging technology, it is necessary to design a passivation layer structure which can at least effectively avoid delamination of a passivation layer during testing.

SUMMARY

The invention proposes a semiconductor device package structure and a method for fabricating the same, so as to effectively avoid delamination of a passivation layer in a packaging technology.

In an embodiment, the invention proposes a semiconductor device package structure, including a substrate. The substrate has a circuit structure formed in a die region. The die region is defined by a plurality of scribe lines configured on the substrate. A seal ring is disposed in the substrate and located at a periphery region of the die region, and surrounds at least a portion of the circuit structure. A trench ring is disposed in the substrate between the seal ring and the scribe lines. A packaging passivation cap layer covers over the circuit structure and the seal ring, and covers at least the trench ring.

In an embodiment, for the semiconductor element package structure, the circuit structure includes a circuit portion and an inner dielectric layer configured to support the circuit portion.

In an embodiment, for the semiconductor element package structure, the seal ring is configured to prevent moisture from entering the circuit structure.

In an embodiment, for the semiconductor element package structure, a top surface of the seal ring includes a bump surface.

In an embodiment, for the semiconductor element package structure, a predetermined fabricating condition for a periphery of the packaging passivation cap layer is to reach at least an outer side wall of the trench ring.

In an embodiment, for the semiconductor element package structure, the periphery of the packaging passivation cap layer extends outward from the outer side wall of the trench ring by a distance.

In an embodiment, for the semiconductor element package structure, the periphery of the packaging passivation cap layer extends outward from the outer side wall of the trench ring by at least a fabrication variance of the packaging passivation cap layer at an edge position of the periphery.

In an embodiment, for the semiconductor element package structure, a predetermined fabricating condition for a periphery of the packaging passivation cap layer is to extend outward from an outer side wall of the seal ring by a predetermined distance.

In an embodiment, for the semiconductor element package structure, the predetermined distance is at least a fabrication variance of the packaging passivation cap layer at an edge position of the periphery.

In an embodiment, for the semiconductor element package structure, each of the scribe lines includes a predetermined portion for cutting that is not covered by the packaging passivation cap layer.

In an embodiment, the invention further proposes a method for fabricating a semiconductor device package structure. The fabricating method includes providing a substrate, where the substrate has a circuit structure formed in a die region, the die region being defined by a plurality of scribe lines configured on the substrate; forming a seal ring in the substrate, the seal ring being located at a periphery region of the die region and surrounding at least a portion of the circuit structure; forming a trench ring in the substrate between the seal ring and the scribe lines; and forming a packaging passivation cap layer covering over the circuit structure and the seal ring and covering at least the trench ring.

In an embodiment, for the method for fabricating the semiconductor element package structure, the circuit structure includes a circuit portion and an inner dielectric layer configured to support the circuit portion.

In an embodiment, for the method for fabricating the semiconductor element package structure, the seal ring is configured to prevent moisture from entering the circuit structure.

In an embodiment, for the method for fabricating the semiconductor element package structure, a top surface of the seal ring includes a bump surface.

In an embodiment, for the method for fabricating the semiconductor element package structure, in the step of forming the packaging passivation cap layer, a predetermined fabricating condition for a periphery of the packaging passivation cap layer is to reach at least an outer side wall of the trench ring.

In an embodiment, for the method for fabricating the semiconductor element package structure, the periphery of the packaging passivation cap layer extends outward from the outer side wall of the trench ring by a distance.

In an embodiment, for the method for fabricating the semiconductor element package structure, the periphery of the packaging passivation cap layer extends outward from the outer side wall of the trench ring by at least a fabrication variance of the packaging passivation cap layer at an edge position of the periphery.

In an embodiment, for the method for fabricating the method for fabricating the semiconductor element package structure, in the step of forming the packaging passivation cap layer, a predetermined fabricating condition for a periphery of the packaging passivation cap layer is to extend outward from an outer side wall of the seal ring by a predetermined distance.

In an embodiment, for the method for fabricating the method for fabricating the semiconductor element package structure, the predetermined distance is at least a fabrication variance of the packaging passivation cap layer at an edge position of the periphery.

In an embodiment, for the method for fabricating the semiconductor element package structure, each of the scribe lines includes a predetermined portion for cutting that is not covered by the packaging passivation cap layer.

BRIEF DESCRIPTION OF THE DRAWINGS

The accompanying drawings are included to provide a further understanding of the invention, and are incorporated in and constitute a part of this specification. The accompanying drawings illustrate embodiments of the invention and, together with the description, serve to explain the principles of the invention.

DESCRIPTION OF THE EMBODIMENTS

The invention relates to a semiconductor device package structure and a method for fabricating the same. The invention looks into a traditional package structure, and it is at least observed that a covering manner of a general packaging passivation cap layer may cause delamination of the passivation cap layer. After detailed investigation, the invention proposes a manner of disposing the packaging passivation cap layer, so that at least delamination of the passivation layer can be reduced.

Figure 1:
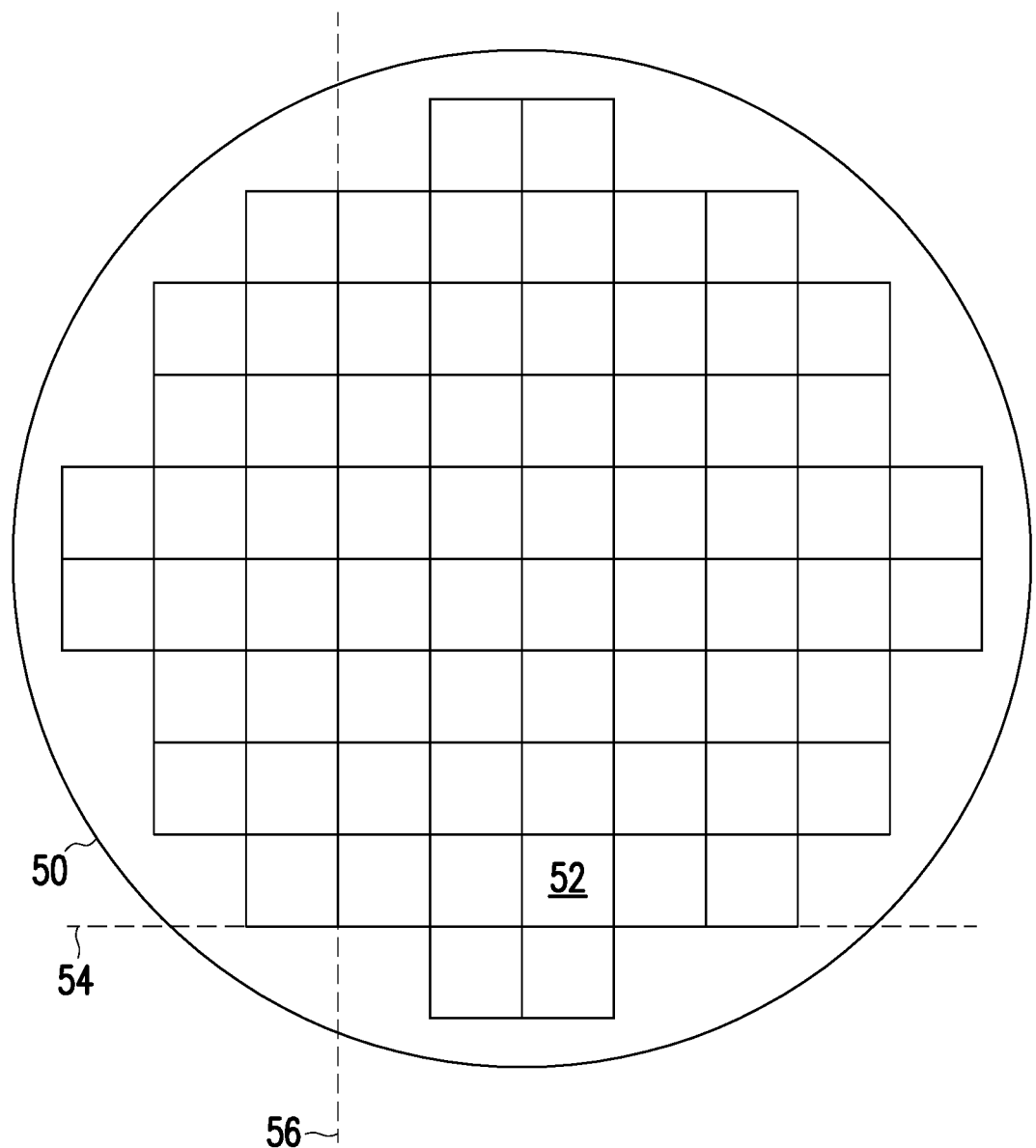
FIG. 1 is a schematic diagram of a general scribe line on a wafer.

FIG. 1 is a schematic diagram of a general scribe line on a wafer. Referring to FIG. 1, a process of fabricating a semiconductor starts from a wafer. A plurality of horizontal scribe lines 54 and a plurality of vertical scribe lines 56 are configured on the wafer 50. The plurality of horizontal scribe lines 54 and vertical scribe lines 56 intersect to define a die region 52. Integrated circuits are simultaneously fabricated in all die regions 52. After the integrated circuit is fabricated, the wafer 50 and the formed integrated circuit are cut into a plurality of circuit dies along the predetermined scribe lines 54 and 56.

Figure 2:
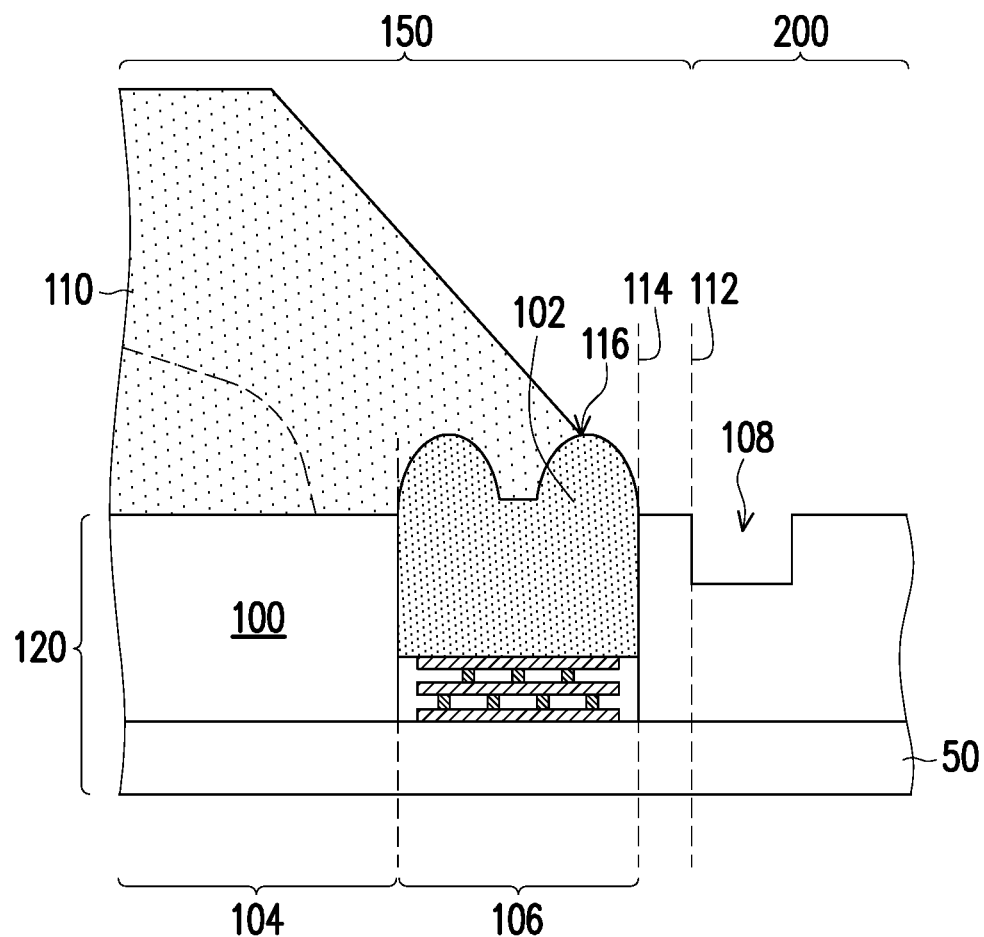
FIG. 2 is a schematic diagram of a package structure in which delamination may occur at a passivation layer and an inner seal layer according to the invention.

FIG. 2 is a schematic diagram of a package structure in which delamination may occur at a passivation layer and an inner seal layer according to the invention. Referring to FIG. 2, a scribe line 200 is configured on the wafer 50. The scribe line 200 defines a die region 150. According to a semiconductor fabricating technology, a circuit structure 100 is completed on a silicon substrate 50 according to a to-be-fabricated circuit structure. For example, the circuit structure includes a transistor structure, an insulating structure, a device isolating structure, an inner dielectric layer structure, an interconnect structure, and the like, but the invention is not limited thereto. The circuit structures 100 are completed in the die region 150. The wafer 50, the circuit structure 100, and the like as a whole may be considered as a substrate 120 in a fabricating stage in a broad sense, and other structures are to be fabricated thereon subsequently.

A seal ring 102 is further formed on a periphery of the die region 150 of the substrate 120. The die region 150 may be further divided into, for example, a circuit region 104 and a periphery region 106. The main circuit structure 100 is formed in the circuit region 104, and the seal ring 102 is formed in the periphery region 106 to surround the circuit structure 100. In addition, the seal ring 102 in the periphery region 106 includes, for example, a dielectric material at an upper layer and a metal structure including an enclosure at a lower layer, but the invention is not limited thereto. The seal ring 102 is an inner seal ring, and has a depth reaching, for example, the wafer 50. The seal ring can completely enclose the circuit structure 100. The seal ring is usually configured to prevent (resist) moisture from entering the circuit structure 100, thereby avoiding damage in the circuit structure 100.

The seal ring 102 generally does not have an even surface, but has a surface structure with a bump. In addition, outside the seal ring 102, there is a trench ring 108 in a line width region of the scribe line 200. The trench ring is configured to cushion a cutting stress during subsequent cutting, to prevent the die from being damaged due to the cutting stress during cutting of the die into individual ones. There is a predetermined distance between an inner side wall 112 of the trench ring 108 and an outer side wall 114 of the seal ring 102, for example, about 2.25 microns, but the invention is not limited thereto.

Figure 3:
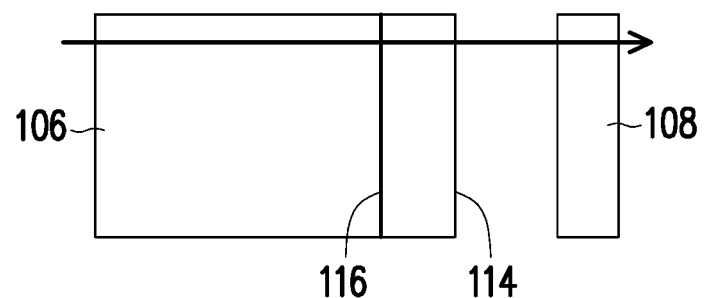
FIG. 3 is a schematic diagram of a top-view structure of the packaging passivation layer and the inner seal layer in FIG. 2 according to the invention.

Before cutting, a packaging passivation cap layer 110 is formed to cover the circuit structure 100 and the seal ring 102. FIG. 3 is a schematic diagram of a top-view structure of the packaging passivation layer and the inner seal layer in FIG. 2 according to the invention. Referring to FIG. 2 and FIG. 3, the packaging passivation cap layer 110 is expected to cover the circuit structure 100 and the seal ring 102.

It should be noted herein that a fabricating condition required for the packaging passivation cap layer 110 during design is to cover the outer side wall 114 of the seal ring 102. However, the packaging passivation cap layer generally does not reach the inner side wall 112 of the trench ring 108, that is, does not cover the trench ring 108.

In addition, the packaging passivation cap layer 110 may refer to an upper packaging passivation cap layer 110. For example, there are two packaging passivation cap layers 110, which are shown by dashed lines, but the invention is not limited thereto. A lower packaging passivation cap layer is in contact with the circuit structure 100. There may be other circuits on the lower packaging passivation cap layer, and the upper packaging passivation cap layer covers thereon. The upper layer and the lower layer are combined into the packaging passivation cap layer 110. The invention is not limited to internal circuits of the actual circuit structure 100 and the packaging passivation cap layer 110. The descriptions thereof are omitted herein. The invention further considers delamination that may occur at an edge 116 of the packaging passivation cap layer 110.

According to an actual fabricating error, the edge 116 of the packaging passivation cap layer 110 has a fabrication variance from an expected formation position. Therefore, a position of an actually completed edge 116 may retract inward and fall on the bump surface of the seal ring 102.

For the formation condition for the packaging passivation cap layer 110, after detailed investigation, it is observed that delamination may occur between the packaging passivation cap layer 110 and the seal ring 102. As mentioned above, based on fabricating accuracy of the fabricating process of the packaging passivation cap layer 110, the edge 116 of the packaging passivation cap layer 110 may vary. Therefore, the edge 116 may fall on the bump surface of the seal ring 102 in a retracted state. The packaging passivation cap layer 110 is made of, for example, polybenzoxazole (PBO). Some tests, such as an SMT, are performed on a plurality of fabricated dies before the dies are separated into individual dies. Because the edge 116 of the packaging passivation cap layer 110 may fall on the bump surface of the seal ring 102, the edge has a relatively weak adhesive force and cannot withstand a testing stress, resulting in delamination and causing damage to the integrated circuit.

Figure 4:
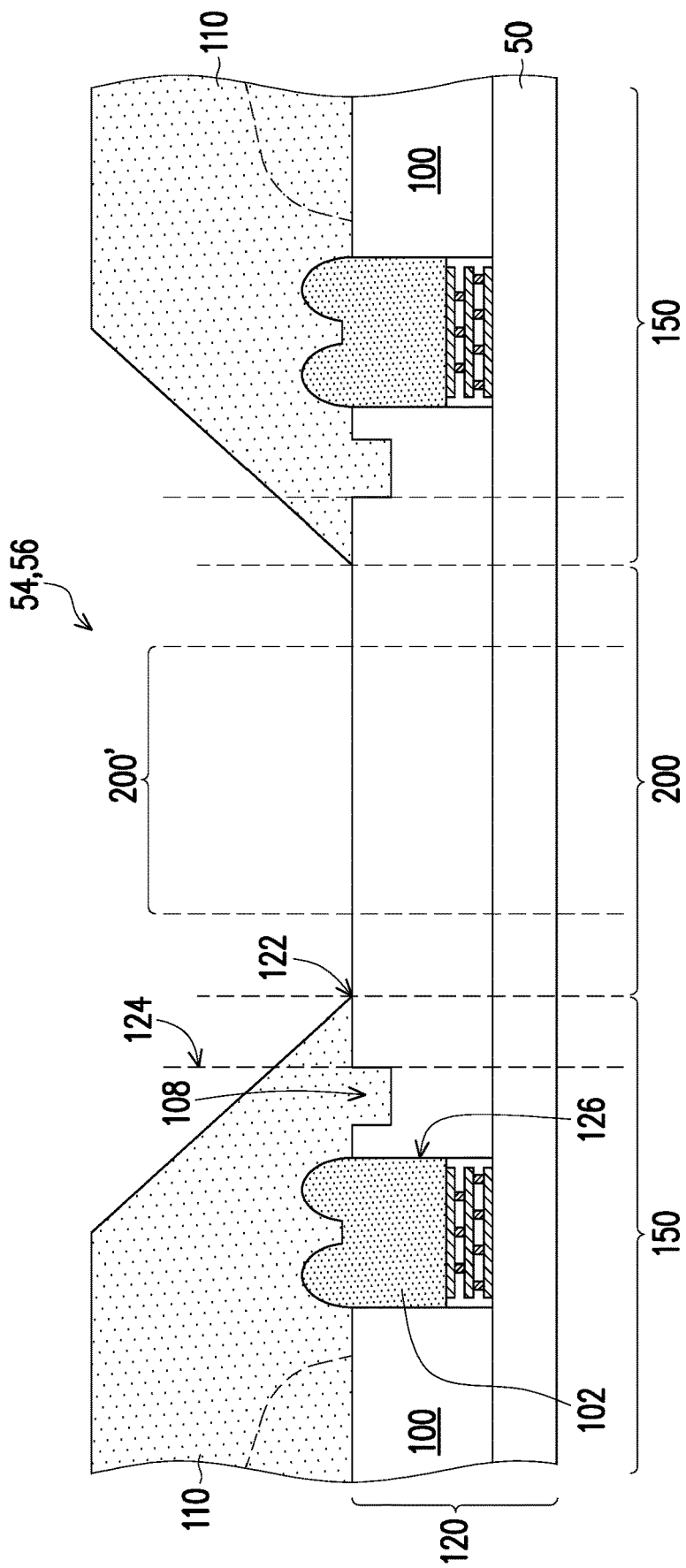
FIG. 4 is a schematic cross-sectional structural diagram of a semiconductor device package structure according to an embodiment of the invention.

The invention further proposes a fabricating condition for the packaging passivation cap layer 110, so that a probability of delamination can be reduced. FIG. 4 is a schematic cross-sectional structural diagram of a semiconductor device package structure according to an embodiment of the invention.

Referring to FIG. 4, the substrate 120 has a preconfigured scribe line 200 corresponding to the scribe lines 54 and 56 in FIG. 1. The scribe line 200 defines a die region 150. A circuit structure 100 and a seal ring 102 surrounding the circuit structure 100 are formed in the die region 150, so that moisture can be prevented from entering the circuit structure 100. As described above, a trench ring 108 is formed outside of the seal ring 102 and surrounding the seal ring 102. The trench ring 108 has an outer side wall 124. The seal ring 102 also has an outer side wall 126.

The fabricating condition for the packaging passivation cap layer 110 of the invention is set as follows: an edge 122 of the packaging passivation cap layer can cover at least the outer side wall 124 of the trench ring 108. In an embodiment, the edge 122 of the packaging passivation cap layer 110 is separated from the outer side wall 124 of the trench ring 108 by a predetermined distance. A region not covered by the packaging passivation cap layer 110 is provided on the scribe line 200 for die saw which provides a sufficient reserved cutting region 200' for cutting the wafer into individual dies.

In an embodiment of the invention, the edge 122 of the packaging passivation cap layer 110 of the invention covers at least the outer side wall 124 of the trench ring 108. In this way, during actual forming of the packaging passivation cap layer 110, even if an actual formation position of the edge 122 of the packaging passivation cap layer retracts inward based on a variance due to fabricating accuracy, a position of the edge 122 does not fall on the bump surface of the seal ring 102 substantially since the edge is away from the outer side wall 126 of the seal ring 102 by a safe distance. In this way, delamination of the packaging passivation cap layer 110 can be effectively avoided.

In an embodiment, the trench ring 108 has a width of, for example, 1.8 micrometers. As shown in FIG. 2 and FIG. 3, there is a predetermined distance between the inner side wall of the trench ring 108 and an outer side wall 126 of the seal ring 102, for example, about 2.25 microns. Therefore, even if the edge 122 of the packaging passivation cap layer 110 retracts inward due to an effect of the fabricating accuracy, the edge 122 of the packaging passivation cap layer still does not fall on the seal ring 102 substantially. In an embodiment, the edge 122 of the packaging passivation cap layer 110 is merely required to cover the trench ring 108, between which there is at least a predetermined distance between the inner side wall 112 of the trench ring 108 and the outer side wall 124 of the seal ring 102.

In another embodiment, from a perspective of the outer side wall 126 of the seal ring 102, the condition for the packaging passivation cap layer 110 may be set to control the edge 122 of the packaging passivation cap layer to extend outward from the outer side wall 126 of the seal ring 102 by at least the foregoing fabrication position variance. In this way, even if the formed edge 122 is shifted inward due to the influence of the fabricating accuracy, the edge still does not fall on the uneven surface of the seal ring 102 substantially, so that at least delamination can be reduced.

The invention further provides a method for fabricating a semiconductor device package structure. In an embodiment, the fabricating method includes: providing a substrate, where the substrate has a circuit structure formed in a die region, the die region being defined by a plurality of scribe lines configured on the substrate; forming a seal ring in the substrate, the seal ring being located at a periphery region of the die region and surrounding the circuit structure; forming a trench ring in the substrate between the seal ring and the scribe lines; and forming a packaging passivation cap layer covering over the circuit structure and the seal ring and covering at least the trench ring.

Finally, it should be noted that the foregoing embodiments are merely used for describing the technical solutions of the invention, but are not intended to limit the invention. Although the invention is described in detail with reference to the foregoing embodiments, a person of ordinary skill in the art should understand that, modifications may still be made to the technical solutions in the foregoing embodiments, or equivalent replacements may be made to part or all of the technical features; and these modifications or replacements will not cause the essence of corresponding technical solutions to depart from the scope of the technical solutions in the embodiments of the invention.

What is claimed is:

1. A semiconductor device package structure, comprising:
   a substrate comprising a circuit structure formed in a die region, wherein the die region is defined by a plurality of scribe lines configured on the substrate, and each of the scribe lines has a reserved cutting region;

a seal ring, disposed in the substrate, located at a periphery region of the die region, and surrounding at least a portion of the circuit structure, wherein a top surface of the seal ring comprises a bump surface;

a trench ring disposed in the substrate between the seal ring and the scribe reserved cutting region, and the trench ring and the reserved cutting region are separated by a distance, wherein the top surface of the seal ring is higher than a top surface of trench ring; and a packaging passivation cap layer covering over the circuit structure and the seal ring and filling up at least the trench ring, wherein a bottom surface of the trench ring opposite to the top surface of the trench ring is higher than a bottom surface of the seal ring opposite to the top surface of the seal ring.

2. The semiconductor device package structure according to claim 1, wherein the circuit structure comprises a circuit portion and an inner dielectric layer configured to support the circuit portion.

3. The semiconductor device package structure according to claim 1, wherein the seal ring is configured to prevent moisture from entering the circuit structure.

4. The semiconductor device package structure according to claim 1, wherein a predetermined fabricating condition for a periphery of the packaging passivation cap layer is to reach at least an outer side wall of the trench ring.

5. The semiconductor device package structure according to claim 4, wherein the periphery of the packaging passivation cap layer extends outward from the outer side wall of the trench ring by a distance.

6. The semiconductor device package structure according to claim 4, wherein the periphery of the packaging passivation cap layer extends outward from the outer side wall of the trench ring by at least a fabrication variance of the packaging passivation cap layer at an edge position of the periphery.

7. The semiconductor device package structure according to claim 1, wherein a predetermined fabricating condition for a periphery of the packaging passivation cap layer is to extend outward from an outer side wall of the seal ring by a predetermined distance.

8. The semiconductor device package structure according to claim 7, wherein the predetermined distance is at least an amount of fabrication variation of the packaging passivation cap layer at the peripheral edge position.

9. The semiconductor device package structure according to claim 1, wherein each of the scribe lines comprises a predetermined portion for cutting that is not covered by the packaging passivation cap layer.

10. A method for fabricating a semiconductor device package structure, comprising:

providing a substrate comprising a circuit structure formed in a die region, wherein the die region is defined by a plurality of scribe lines configured on the substrate, and each of the scribe lines has a reserved cutting region;

forming a seal ring in the substrate, the seal ring being located at a periphery region of the die region and surrounding at least a portion of the circuit structure, wherein a top surface of the seal ring comprises a bump surface;

forming a trench ring in the substrate between the seal ring and the reserved cutting region, and the trench ring and the reserved cutting region are separated by a distance, wherein the top surface of the seal ring is higher than a top surface of trench ring; and forming a packaging passivation cap layer covering over the circuit structure and the seal ring and filling up at least the trench ring, wherein a bottom surface of the trench ring opposite to the top surface of the trench ring is higher than a bottom surface of the seal ring opposite to the top surface of the seal ring.

11. The method for fabricating the semiconductor device package structure according to claim 10, wherein the circuit structure comprises a circuit portion and an inner dielectric layer configured to support the circuit portion.

12. The method for fabricating the semiconductor device package structure according to claim 10, wherein the seal ring is configured to prevent moisture from entering the circuit structure.

13. The method for fabricating the semiconductor device package structure according to claim 10, wherein in the step of forming the packaging passivation cap layer, a predetermined fabricating condition for a periphery of the packaging passivation cap layer is to reach at least an outer side wall of the trench ring.

14. The method for fabricating the semiconductor device package structure according to claim 13, wherein the periphery of the packaging passivation cap layer extends outward from the outer side wall of the trench ring by a distance.

15. The method for fabricating the semiconductor device package structure according to claim 13, wherein the periphery of the packaging passivation cap layer extends outward from the outer side wall of the trench ring by at least a fabrication variance of the packaging passivation cap layer at an edge position of the periphery.

16. The method for fabricating the semiconductor device package structure according to claim 10, wherein in the step of forming the packaging passivation cap layer, a predetermined fabricating condition for a periphery of the packaging passivation cap layer is to extend outward from an outer side wall of the seal ring by a predetermined distance.

17. The method for fabricating the semiconductor device package structure according to claim 16, wherein the predetermined distance is at least an amount of fabrication variation of the packaging passivation cap layer at the peripheral edge position.

18. The method for fabricating the semiconductor device package structure according to claim 10, wherein each of the scribe lines comprises a predetermined portion for cutting that is not covered by the packaging passivation cap layer.

* * * * *